(12) United States Patent
Liu et al.

(10) Patent No.: US 6,929,058 B2
(45) Date of Patent: Aug. 16, 2005

(54) COLD PLATE WITH VORTEX GENERATOR

(75) Inventors: Min-Sheng Liu, TaiChung (TW);
Chi-Chung Wang, Hsinchu (TW);
Yu-Juei Chang, Hsinchu (TW);
Jane-Sunn Liaw, TaiChung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/705,980

(22) Filed: Nov. 13, 2003

(65) Prior Publication Data

US 2005/0011635 A1 Jan. 20, 2005

(51) Int. Cl.[7] ................................................. F28F 3/02
(52) U.S. Cl. ............................ 165/80.3; 165/104.33
(58) Field of Search .......................... 165/80.3–80.5, 165/109.1, 104.33; 62/259.2

(56) References Cited

U.S. PATENT DOCUMENTS

| | | | | |
|---|---|---|---|---|
| 1,743,861 A | * | 1/1930 | Modine | 165/151 |
| 3,741,285 A | * | 6/1973 | Kuethe | 165/109.1 |
| 4,577,681 A | * | 3/1986 | Hughes | 165/109.1 |
| 4,997,036 A | * | 3/1991 | Schulze et al. | 165/182 |
| 5,361,828 A | * | 11/1994 | Lee et al. | 165/109.1 |
| 5,791,405 A | * | 8/1998 | Takiura et al. | 165/184 |
| 5,975,199 A | * | 11/1999 | Park et al. | 165/151 |
| 6,590,770 B1 | * | 7/2003 | Rogers et al. | 165/80.3 |
| 6,655,449 B1 | * | 12/2003 | Hsien | 165/80.4 |

* cited by examiner

*Primary Examiner*—Teresa J. Walberg
(74) *Attorney, Agent, or Firm*—Troxell Law Office, PLLC

(57) ABSTRACT

The present invention discloses a cold plate with vortex generator for fluid going through defined an inlet and an outlet according to the flowing directions of the fluid, comprising: a base having a groove, one end of the groove is connected to the inlet and another end is connected to the outlet; a body installed on the base; at least one vortex generator mounted on a surface of the body toward the groove of the base, wherein two unparallel and symmetrical ribs form the vortex generator, one end of the unparallel ribs is a contraction end with a shorter gap, another end is an expansion end with a longer gap, coolant can pass through the gap between the ribs, due to each rib having a sharp portion, an appearance of the rib is a triangle geometric figure. The vortexes increase the liquid mixture and improve the heat transfer on the cold plate, but not cause much pressure drop, therefore the heat transfer of the entire system is more efficient.

8 Claims, 7 Drawing Sheets

COLD PLATE WITH VORTEX GENERATOR

BACKGROUND OF THE INVENTION

1. Field of the Invention

The present invention generally relates to a cold plate with vortex generator, especially to the cold plate with vortex generator having symmetrical ribs for producing a pair of positive or negative vortexes.

2. Description of the Prior Art

Please refer to FIG. 1, which shows a layout of a cooling device in prior arts. The arrangement of a cooling fan 2 cooperating with a heat sink 3 assembled on an electrical component 1 to cool down the electrical component 1 is the most common usage and has been adopted for a couple of years; however, due to quick development, electrical component is getting smaller and its process performance is getting better, while heat load on each component is much more than before. As the aforesaid arrangement in prior art, the heat load is about 60 W and not qualified to meet the present requirement, which therefore extremely damages both the electrical component and the system using that component.

To overcome the problem of heat load in prior art, another cooling method using enforcing mechanism with liquid is developed, such as the method disclosed in Taiwan Patent Numbers 537442, 437992, 509349 and 450378. These patents disclose the method using coolant for heat load. Referring to FIG. 2 and FIG. 3, which show a cold plate and a heat transfer system employing the cold plate in prior arts. Traditionally, a cold plate 4 has a recycling tube 41 for coolant, two ends of the recycling tube 41 individually connect to an input tube 42 and an output tube 43. The cold plate 4 is adhered on the electrical component 1. Continuously the input tube 42 is connected to a pump 5, and the pump 5 is connected to a tank 6, and the output tube 43 goes through a radiator 7, a fan 8 and goes back to the tank 6 to form a complete cooling cycle. Following is how coolant works for heat load: the pump 5 pumps up the coolant first from the tank 6, then the coolant traverses the input tube 42 and the recycling tube 41 of the cold plate 4. Due to the cold plate 4 adhered on the electrical component 1, the coolant can dissipate the heat generated by the electrical components 1 out of the output tube 43, afterward, the coolant with heat is cooled down by the radiator 7 and the fan 8 and flows back to the tank 6, thereby the heat is exhausted to the air. Again the pump 5 draws the coolant out from the tank 6 and so on to start another cooling cycle.

Referring to FIG. 4, which is a diagram showing the formation of a thermal boundary layer in prior arts. As seen, the coolant 9 generates convection effect on the surface of the electrical component 1, Since the thermal boundary layer 91 is with high temperature, it is as a barrier for convection of the coolant plate and the coolant 9A, therefore the heat transfer effect is down.

For the issue of insufficient heat transfer derived from the thermal boundary layer effect, in order to have an average and mixed convection for the fluid on two sides of the thermal boundary layer, the common skill used at present is the method of producing vortexes. Such skill can be found in Taiwan Patent Numbers 535854, 511705, 446109 and 257347. All of these prior arts adopt vortexes to disturb the thermal boundary layer for promoting heat transfer effect; and, the prior arts also improve the structures of radiating blades or radiating fins, such as in Patent Numbers of 446109 and 511705. Mainly, the vortex generator is designed to surround the coolant tube, hence vortexes are produced between the coolant tube and the vortex generator while fluid getting past the coolant tube; the mixture for fluid is more complete to approach better heat conduction.

According to aforesaid, producing vortexes to mix fluid has been taken on for a couple of years, but the improvement has never been focused on "liquid-cooling cold plate". In the near future, the requirement of the heat load of electronic component will be about 200 W, more, the heat flux required is approximately 125 W/cm$^2$, therefore the tendency of high processing speed, small sizes and light weight in electrical field makes the heat load become a very important issue.

SUMMARY OF THE INVENTION

The main objective of the present invention is to offer a cold plate with vortex generator, the vortex generator with symmetrical ribs produce a pair of positive or negative vortexes for increasing liquid mixture and improving heat transfer on surfaces of the cold plates, so, the heat transfer of the cold plates can then be advanced and the pressure drop associated is not much, and the whole system efficiency shall be highly increased.

To approach above objective, two unparallel and symmetrical ribs protruding out of cold plates form the vortex generator of the present invention. One of two pairs of ends of the unparallel ribs is a contraction end with a shorter gap, while another pair of ends is an expansion end with a longer gap. Coolant can pass through the gap between ribs. Due to each rib having a sharp portion, the appearance of the rib is in a triangle shape, accordingly vortexes are produced while coolant passing through the gap between the ribs for increasing liquid mixture and improving heat transfer on surfaces of the cold plates, the heat transfer of the cold plates can then be advanced and the pressure drop associated is not much and the whole system efficiency shall be highly increased.

Other and further features, advantages and benefits of the invention will become apparent in the following description taken in conjunction with the following drawings. It is to be understood that the foregoing general description and following detailed description are exemplary but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

Figure 5:
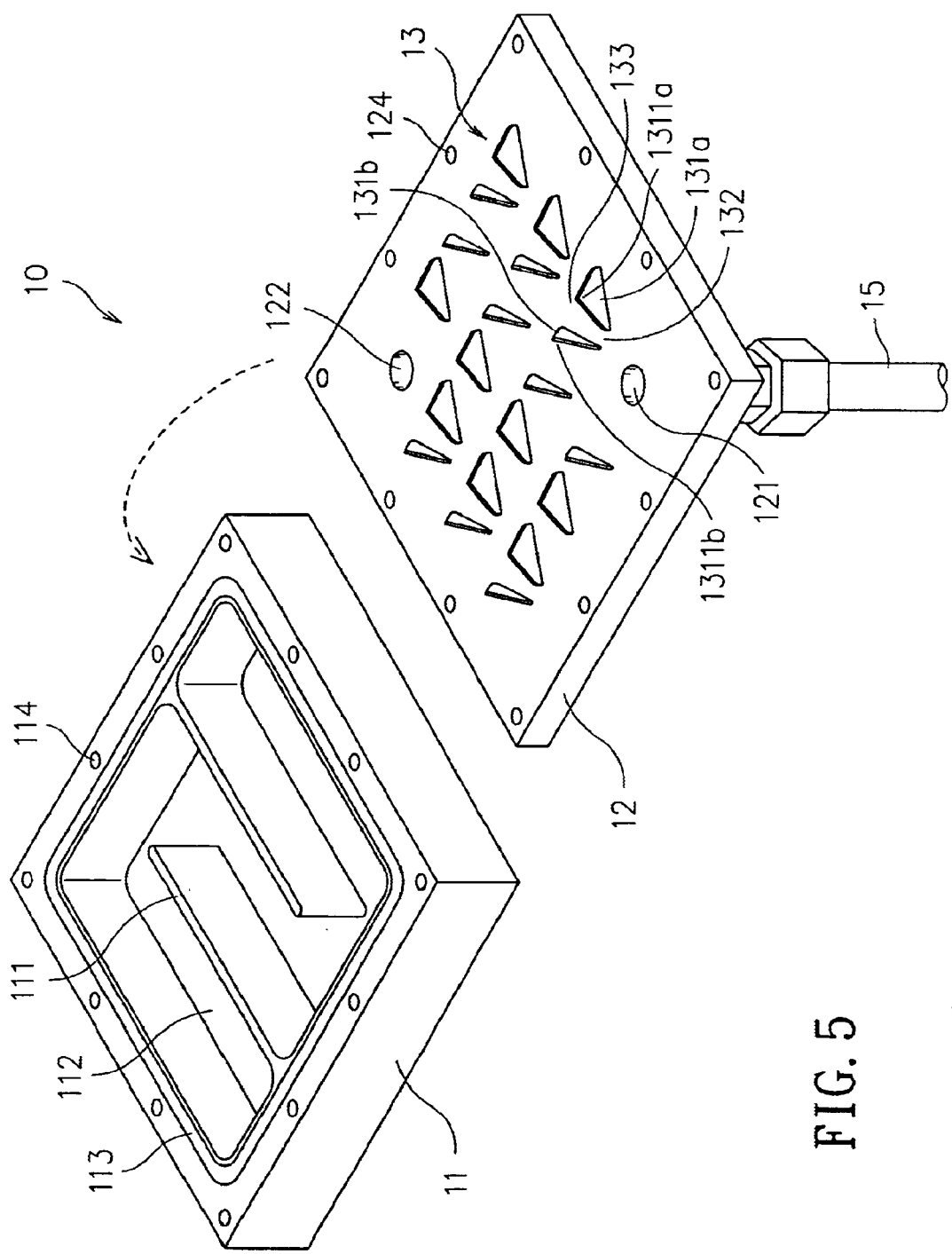
FIG. 5 is a partial exploded 3-D view of a preferred embodiment of the present invention.
Figure 6:
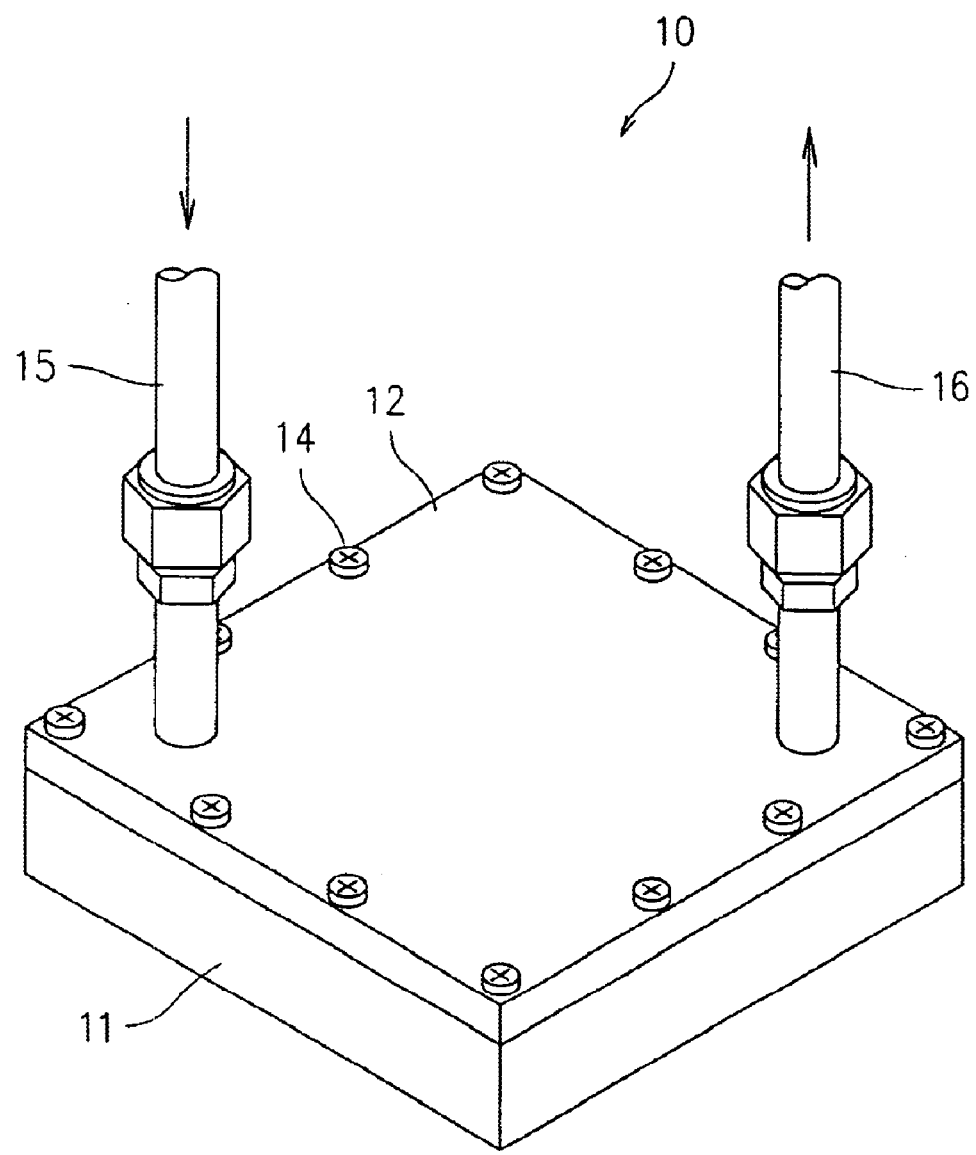
FIG. 6 is an assembled 3-D view of the preferred embodiment of the present invention.

Referring to FIG. 5 and FIG. 6, which are a partial exploded 3-D view of a preferred embodiment of the present invention and an assembled 3-D view of the preferred embodiment of the present invention, wherein a cold plate 10 comprises a base 11 and a plate 12.

The base 11 has a plurality of parallel partition plates 111 therein. The partition plates 111 form a groove 112 in circuitous shape on a bottom of the base 11. A surface of the base 11 toward the plate 12 is set an O-ring 113 made of rubber or the like.

The plate 12 has an inlet 121 and an outlet 122 for coolant. The inlet 121 and the outlet 122 are installed respectively and correspondingly to two ends of the groove 112 of the base 11. The inlet 121 is connected to an input tube 15 externally for inputting the coolant, and the outlet 122 is connected to an output tube 16 externally for outputting the coolant.

At least one vortex generator 13 is mounted on a surface of the plate 12 toward the groove 112 of the base 11. The vortex generator 13 comprises two unparallel and symmetrical ribs 131a and 131b protruding out of the plate 12. One of two pairs of ends of the unparallel ribs 131a and 131b is a contraction end 132 with a shorter gap, another pair of ends is an expansion end 133 with a longer gap. Coolant can pass through the gap between ribs 131a and 131b. Due to the sharp portion 1311a and 1311b of each of the ribs 131a, 131b, a shape of isosceles triangle is formed.

Positions around the plate 12 have screw holes 124 corresponding to screw holes 114 on the base 11. Cooperation of screw holes 124 and 114 is to combine the plate 12 and the base 11 by means of plural bolts 14, as shown in FIG. 6. And by the O-ring layer 113, the cold plate 10 can be sealed and isolated.

Figure 1:
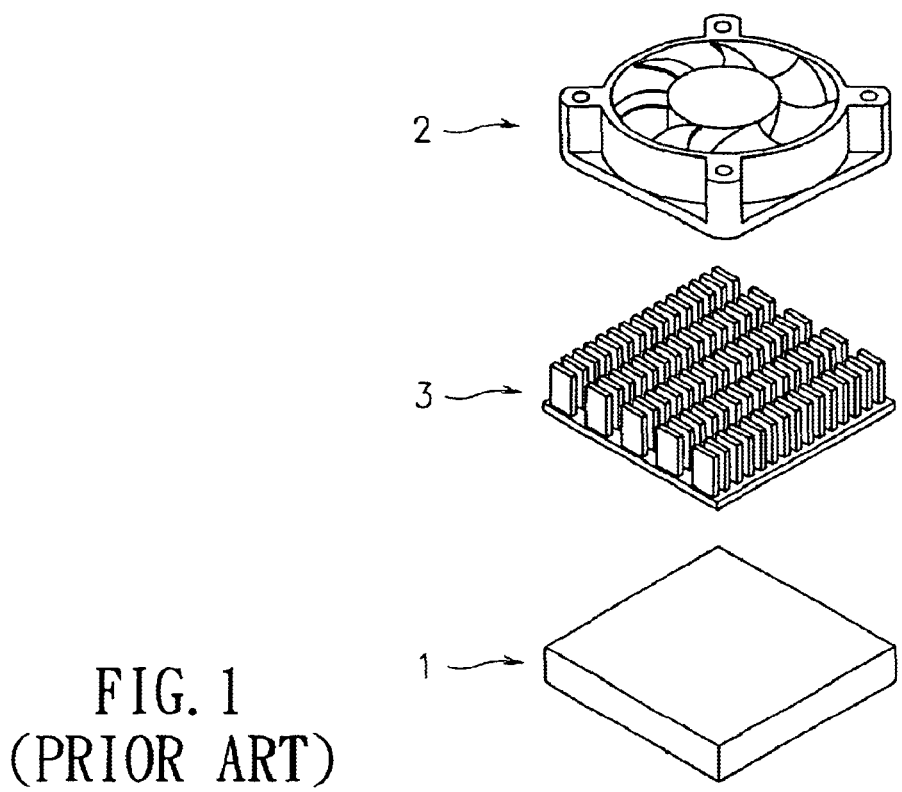
FIG. 1 is a layout of a cooling device in prior arts.
Figure 2:
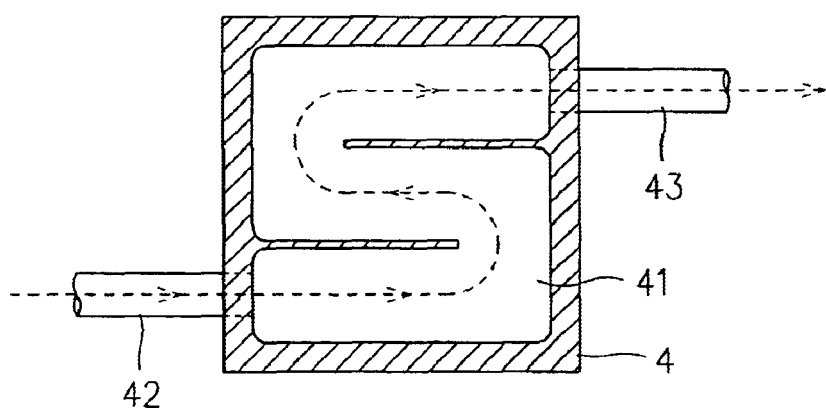
FIG. 2 is a structural diagram of a cold plate in prior arts.
Figure 3:
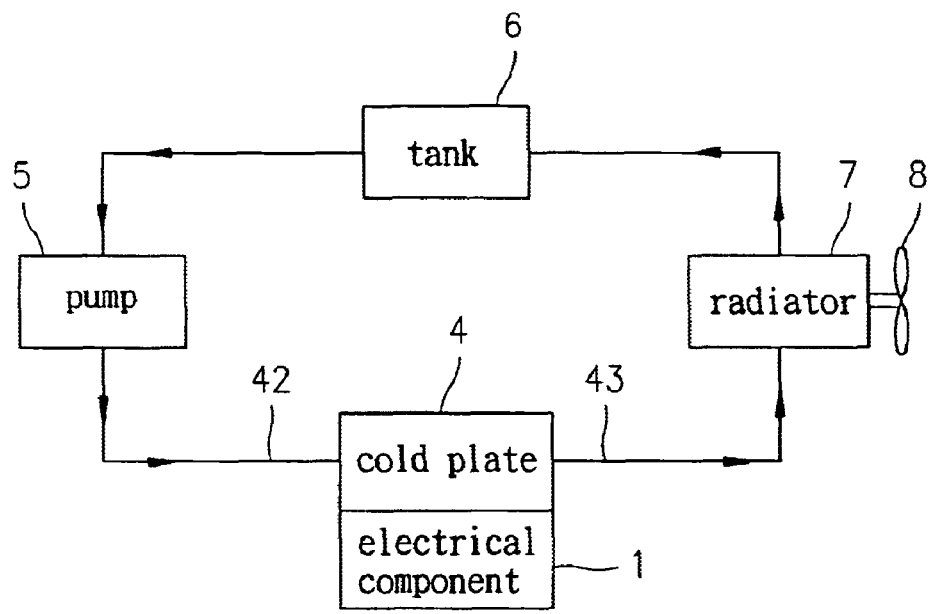
FIG. 3 is a diagram of a heat transfer system of the cold plate in prior arts.
Figure 4:
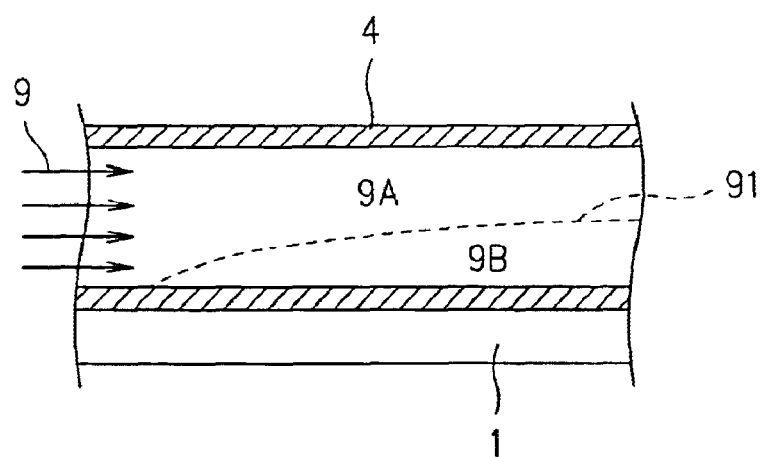
FIG. 4 is a diagram of the formation of the thermal boundary layer in prior arts.

The plate 12 and the base 11 is possibly combined by another different ways, such as a whole body in molding, welding or binding also shall be in the category of the present invention. The inlet 121 and the outlet 122 can be established on one or two sides of the base 11 to connect to the groove 112 other than on the plate 12, which are shown as the prior art in FIG. 2. Any other locations for the inlet 121 or the outlet 122 to connect two ends of the groove 112 may be possible, not restricted by the locations shown in either FIG. 2 or FIG. 5.

Figure 7:
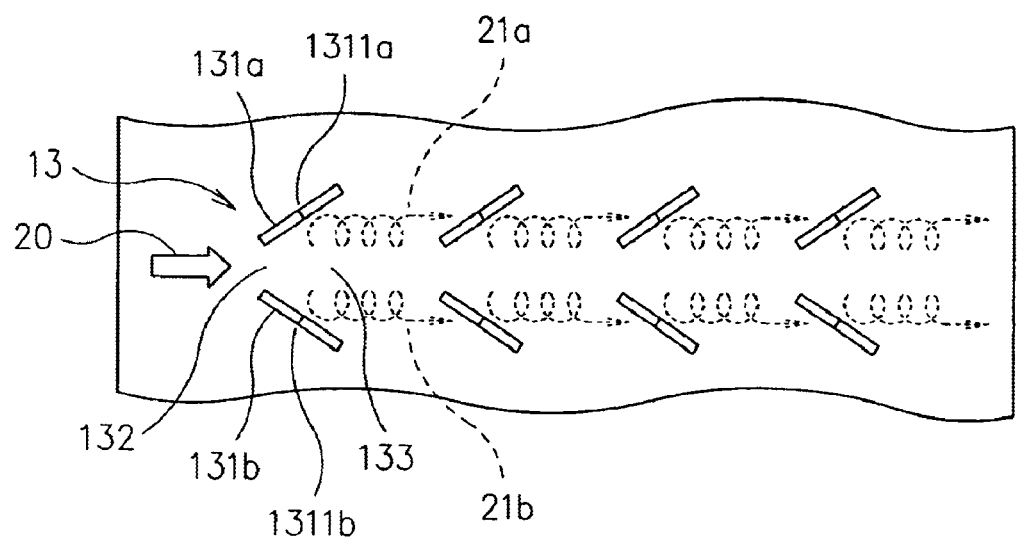
FIG. 7 is a diagram of a first preferred embodiment of a vortex generator of the present invention.

Please refer to FIG. 7, which is a diagram of a first preferred embodiment of the vortex generator of the present invention. The diagram shows that the coolant 20 passes through the ribs 131a and 131b from the contraction end 132 of the vortex generator 13. Because of the vortex generator 13, a pair of vortexes 21a and 21b is formed. Obviously the vortexes 21a and 21b increase the level of the mixture of liquid and improving the heat transfer on the cold plate 10, but do not cause much pressure drop.

Figure 8:
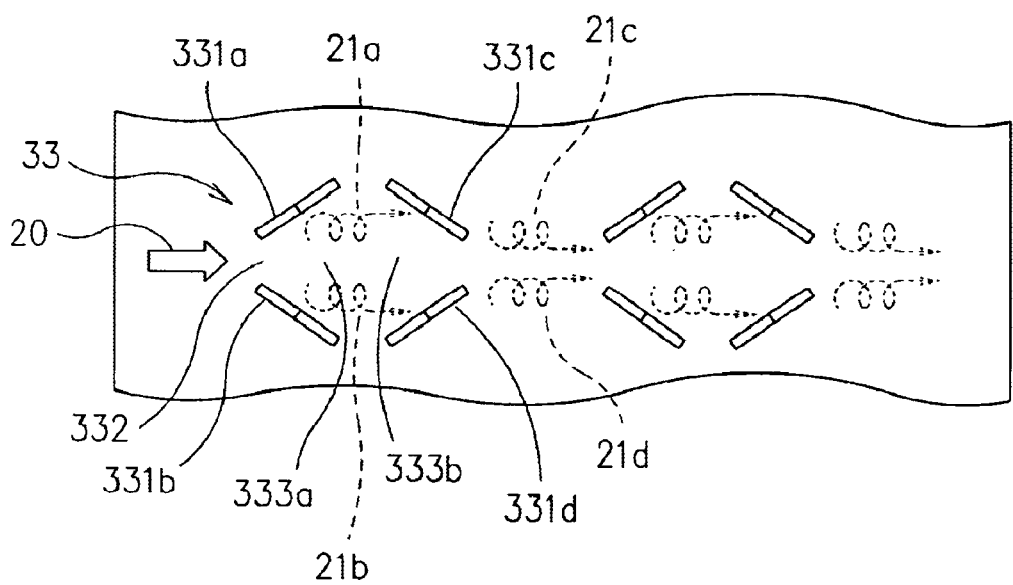
FIG. 8 is a diagram of a second preferred embodiment of the vortex generator of the present invention.

Please refer to FIG. 8, which is a diagram of a second preferred embodiment of the vortex generator of the present invention. The second preferred embodiment has at least two vortex generators 33, wherein another pair of ribs 331c and 331d are placed symmetrically to a pair of ribs 331a and 331b. An expansion end 333a of the ribs 331a and 331b is installed correspondingly to an expansion end 333b of the ribs 331c and 331d. The coolant 20 flows into an area among the ribs 331a, 331b, 331c and 331d from a contraction end 332 of the ribs 331a and 331b, hence, two pairs of vortexes 21a, 21b, 21c and 21d with different rotating directions are produced while the coolant 20 flowing through the area among the ribs 331a, 331b, 331c and 331d to increase levels of the mixture of liquid and improving the heat transfer on the cold plate 10, but do not cause much pressure drop.

Figure 9:
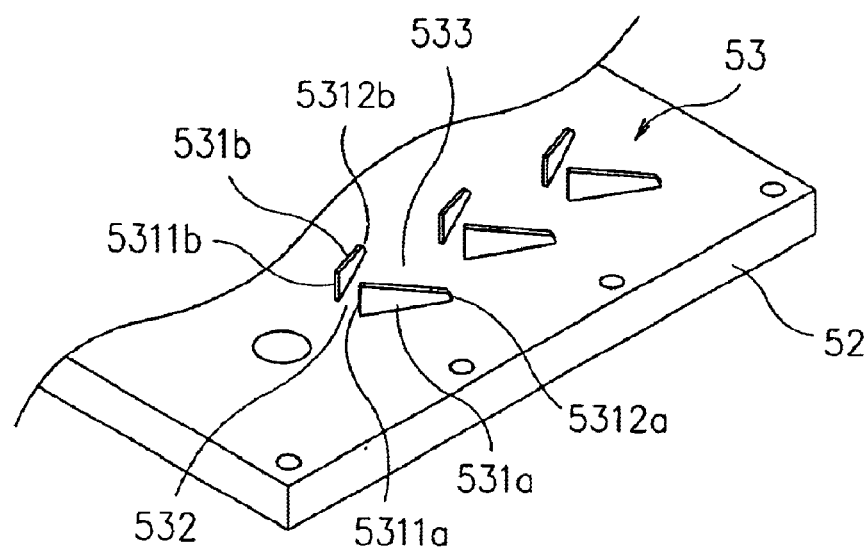
FIG. 9 is a 3-D diagram of a third preferred embodiment of the vortex generator of the present invention.

Please refer to FIG. 9, which is a 3-D diagram of a third preferred embodiment of the vortex generator of the present invention. A body 52 has at least one vortex generator 53. Two unparallel and symmetrical ribs 531a and 531b protruding out of the body 52 form the vortex generator 53. One of two pairs of ends of the unparallel ribs 531a and 531b is a contraction end 532 with a shorter gap, another pair of ends is an expansion end 533 with a longer gap. Coolant can pass through the gap between ribs 531a and 531b. Two sides 5311a and 5311b of the contraction end 532 of the ribs 531a and 531b are perpendicular to the body 52, the sides 5311a and 5311b are higher than the two sides 5312a and 5312b of the expansion end 533 of the ribs 531a and 531b to appear two right triangles of the ribs 531a and 531b. Besides, the ribs 531a and 531b can be distributed in the manner described as the embodiment in FIG. 8.

Figure 10:
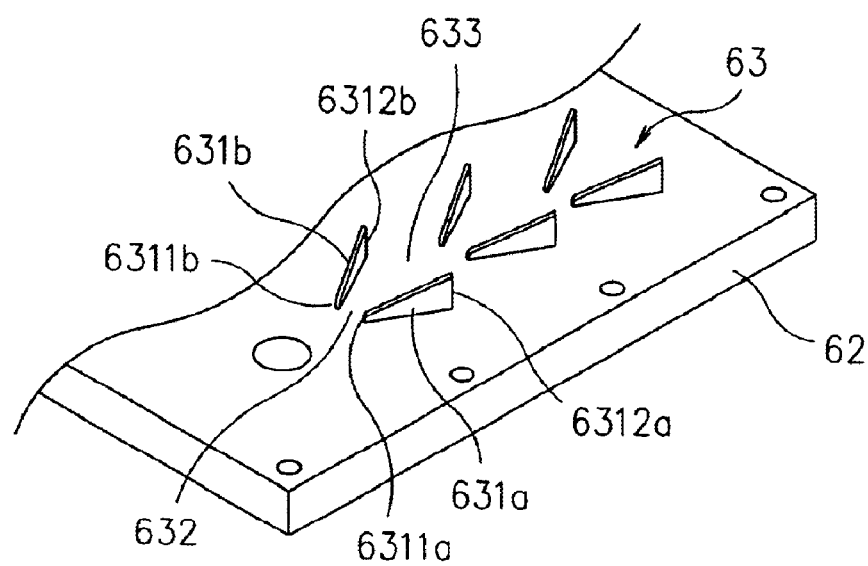
FIG. 10 is a 3-D diagram of a fourth preferred embodiment of the vortex generator of the present invention.

Please refer to FIG. 10, which is a 3-D diagram of a fourth preferred embodiment of the vortex generator of the present invention. A body 62 has at least one vortex generator 63. Two unparallel and symmetrical ribs 631a and 631b protruding out of the body 62 form the vortex generator 63. One of two pairs of ends of the unparallel ribs 631a and 631b is a contraction end 632 with a shorter gap, another pair of ends is an expansion end 633 with a longer gap. Coolant can pass through the gap between ribs 631a and 631b. Two sides 6312a and 6312b of the expansion end 633 of the ribs 631a and 631b are perpendicular to the body 62, the sides 6312a and 6312b are higher than two sides 6311a and 6311b of the contraction end 632 of the ribs 631a and 631b to appear two right triangles of the ribs 631a and 631b. Besides, the ribs 631a and 631b can be distributed in the manner described as the embodiment in FIG. 8.

Figure 11:
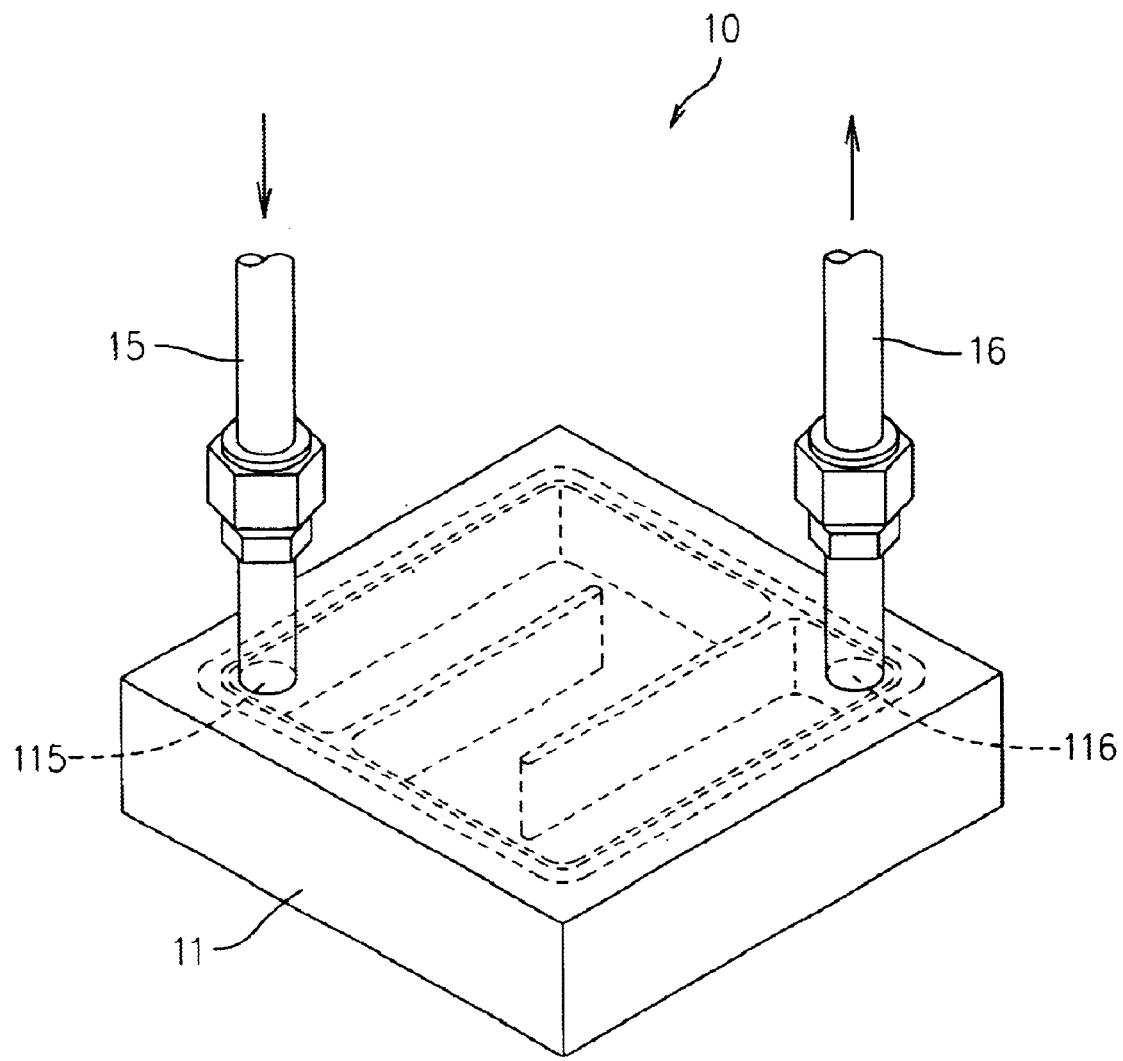
FIG. 11 is a 3-D diagram of a fifth preferred embodiment of the vortex generator of the present invention.

Please refer to FIG. 11, which shows another different embodiment of the present invention. As seen in FIG. 11, a cold plate with vortex generator 10 of the present invention can also comprises: a body 11 having an inlet 115, and outlet 116 and a curved tunnel 112 for flowing fluid, a first end of the tunnel 112 is connected to the inlet 115 and a second end of the tunnel 112 is connected to the outlet 116; and at least one vortex generator mounted on a surface of the tunnel 112. In this embodiment, two unparallel and symmetrical ribs can form the vortex generator, one end of the unparallel ribs is a contraction end with a shorter gap and another end is an expansion end with a longer gap, coolant can pass through the gap between the ribs, and due to each rib having a sharp portion, the appearance of the rib is in a triangle figure. Different shapes of triangle can be formed depending on different locations of the sharp portion. For example, the sharp portion can be on a central of the rib to make the rib an isosceles triangle or a on a side of the rib to make the rib a right triangle wherein the sharp portion is on the contraction end of the ribs or on the expansion end of the ribs. In addition, the sharp portion of the rib can be located either at the contraction end or at the expansion end. The inlet 115 and the outlet 116 are set up on the body 11, and the inlet 115 is connected externally to an input tube 15 for inputting coolant fluid, and the outlet 116 is connected externally to an output tube 16 for outputting coolant fluid. In this embodiment, the cold plate comprises two sets fo vortex generator, each vortex generator is formed by two unparallel and symmetrical ribs, and the expansion ends of the two sets of vortex generator are arranged in a opposite and corresponding manner.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A cold plate with an inlet and an outlet for a fluid comprising:
    a) a base having a groove having first and second ends, the first end being connected to the inlet and the second end connected to the outlet;
    b) a plate connected to the base covering the groove; and
    c) at least one vortex generator located on a surface of the plate and aligning with and extending into the groove of the base, each of the at least one vortex generator having a first pair of unparallel and symmetrical ribs, each of the first pair of unparallel and symmetrical ribs having:
        i) parallel front and rear surfaces extending perpendicular to the surface of the plate;
        ii) first, second, and third edges located between the parallel front and rear surfaces, the first edge being connected to the plate; and
        iii) a sharp portion located between the second and third edges and extending upwardly toward the base, first ends of the first pair of unparallel and symmetrical ribs are positioned a contraction distance apart, and second ends of the first pair of unparallel and symmetrical ribs are positioned a expansion distance apart, the fluid passing between the first pair of unparallel and symmetrical ribs, the contraction distance is smaller than the expansion distance.

2. The cold plate according to claim 1, wherein each of the second and the third edges have equal lengths, and each of the parallel front and rear surfaces of the two unparallel and symmetrical ribs are isosceles triangles.

3. The cold plate according to claim 1, wherein one of the second and the third edges is positioned perpendicular to the surface of the plate and each of the parallel front and rear surfaces of the two unparallel and symmetrical ribs are right triangles.

4. The cold plate according to claim 3, wherein the sharp portion is located on the first end of each of the two unparallel and symmetrical ribs.

5. The cold plate according to claim 3, wherein the sharp portion is located on the second end of each of the two unparallel and symmetrical ribs.

6. The cold plate according to claim 1, wherein the inlet and the outlet are located on the plate, the inlet is connected to an input tube receiving a fluid, the outlet is connected to an output tube discharging the fluid.

7. The cold plate according to claim 1, wherein each of the at least one vortex generator includes a second pair of unparallel and symmetrical ribs, first ends of the second pair of unparallel and symmetrical ribs are positioned the expansion distance apart, and second ends of the second pair of unparallel and symmetrical ribs are positioned the contraction distance apart, the second ends of the first pair of unparallel and symmetrical ribs are positioned adjacent to the first ends of the second pair of unparallel and symmetrical ribs.

8. The cold plate according to claim 1, wherein the base and the plate are integrally formed.

* * * * *